(12) United States Patent
Thielen et al.

(10) Patent No.: US 12,317,441 B2
(45) Date of Patent: May 27, 2025

(54) COMPUTER SYSTEM AND METHOD OF CONNECTING RACK-LEVEL DEVICES

(71) Applicant: Samsung Electronics Co., Ltd., Suwon-si (KR)

(72) Inventors: Casey Glenn Thielen, Chandler, AZ (US); Eric Richard Borch, Fort Collins, CO (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

(21) Appl. No.: 18/417,889

(22) Filed: Jan. 19, 2024

(65) Prior Publication Data

US 2025/0056750 A1   Feb. 13, 2025

Related U.S. Application Data

(60) Provisional application No. 63/531,376, filed on Aug. 8, 2023.

(51) Int. Cl.
| | |
|---|---|
| *G06F 1/16* | (2006.01) |
| *H05K 5/00* | (2025.01) |
| *H05K 7/00* | (2006.01) |
| *H05K 7/02* | (2006.01) |

(52) U.S. Cl.
CPC .................... *H05K 7/026* (2013.01)

(58) Field of Classification Search
CPC .......... H05K 7/026; H05K 7/02; H05K 7/005; H05K 7/10; G06F 3/04164; G06F 3/0416
See application file for complete search history.

(56) References Cited

U.S. PATENT DOCUMENTS

| | | | | |
|---|---|---|---|---|
| 5,352,123 A | * | 10/1994 | Sample | H05K 7/1445 439/61 |
| 6,116,913 A | * | 9/2000 | Gil Delicado | H01R 12/7082 439/61 |
| 10,707,875 B1 | | 7/2020 | Orthner et al. | |
| 10,761,718 B2 | * | 9/2020 | Nakamura | G06F 3/041 |
| 2012/0227026 A1 | | 9/2012 | Goldman et al. | |
| 2014/0237156 A1 | | 8/2014 | Regula et al. | |
| 2014/0268538 A1 | * | 9/2014 | Newbert | H01R 31/06 439/502 |
| 2016/0150662 A1 | * | 5/2016 | Maier | H05K 3/303 361/767 |
| 2016/0181711 A1 | * | 6/2016 | Genetti | H01R 12/71 29/830 |
| 2019/0065041 A1 | * | 2/2019 | Nakamura | G06F 3/041 |
| 2022/0059644 A1 | * | 2/2022 | Kim | H10K 59/18 |
| 2023/0097832 A1 | | 3/2023 | Kuo et al. | |
| 2023/0229044 A1 | | 7/2023 | Yin et al. | |

(Continued)

*Primary Examiner* — Anthony M Haughton

(74) *Attorney, Agent, or Firm* — Lewis Roca Rothgerber Christie LLP

(57) ABSTRACT

A computer supernode including two or more printed circuit boards that each include two or more compute nodes, two or more switches, and two or more connectors. The compute nodes are connected to each switch, and the switches are connected to each connector by a number of lanes. The computer supernode also includes two or more H-cables connecting the printed circuit boards together in an all-to-all configuration. Each H-cable connects a connector of a printed circuit board to a connector in each of two or more other printed circuit boards.

20 Claims, 3 Drawing Sheets

(56) References Cited

U.S. PATENT DOCUMENTS

| | | | | |
|---|---|---|---|---|
| 2023/0254269 A1* | 8/2023 | Lee | .................... | H04L 49/1515 |
| | | | | 370/388 |
| 2024/0311323 A1* | 9/2024 | Borch | ................. | G06F 11/3495 |
| 2024/0329767 A1* | 10/2024 | Kinemura | ............... | G06F 3/016 |

* cited by examiner

COMPUTER SYSTEM AND METHOD OF CONNECTING RACK-LEVEL DEVICES

CROSS-REFERENCE TO RELATED APPLICATION(S)

The present application claims priority to and the benefit of U.S. Provisional Patent Application No. 63/531,376, filed Aug. 8, 2023 entitled "Use of Cabling to Improve Rack-Level Connectivity," the entire content of which is incorporated herein by reference.

BACKGROUND

1. Field

The present application relates to computer systems and methods for connecting computing devices.

2. Description of the Related Art

High communication bandwidth is required to enable very large node counts (e.g., 1024 nodes) to work together to be able to function like an equivalent single node. This bandwidth may be achieved with high-speed differential input/output (HSIO) interfaces, such as PCIe, CXL, or other SerDes-based communication protocols. Since these nodes are typically separately placed on multiple printed circuit boards (PCBs) due to their space requirements, the ability to support communication between them requires connectors between those PCBs. Moreover, because the HSIO signals' speed continue to increase from tens into hundreds of Gigatransfers per second (GT/s), the reach of these signals becomes shorter and shorter when routing through copper traces on PCBs and through copper cables. Therefore, finding routing solutions that minimize route-lengths while still maintaining a desired communication bandwidth (BW) and all-to-all connectivity-architecture (e.g., 1D-Flattened Butterfly) has become increasingly difficult.

Moreover, direct board-to-board connections are limited by the physical space available to fit PCBs within the limits of PCB manufacturing technology, as well as the racks those PCBs will be placed within. As the component count that will connect all-to-all increases up to 1,024 and beyond, there is no reasonable solution to connect them with this method. Additionally, the loss budget of very high-speed signals greatly limits the total length a signal can travel across copper traces on the PCB. Extending this loss budget with retimers/repeaters/redrivers can increase the overall length on a PCB that the signal may travel, but this will increase latency, power consumption, PCB space utilization, and bill of materials (BOM) cost.

The above information disclosed in this Background section is only for enhancement of understanding of the background of the invention and therefore it may contain information that does not constitute prior art.

SUMMARY

The present disclosure relates to various embodiments of a computer supernode. In one embodiment, the computer supernode includes two or more printed circuit boards, and each printed circuit board includes two or more compute nodes, two or more switches, and two or more connectors. The compute nodes are connected to each switch, and the switches are connected to each connector by two or more lanes. The computer supernode also includes two or more H-cables connecting the printed circuit boards together in an all-to-all configuration. Each H-cable connects a connector of a first printed circuit board to a connector in each of two or more other printed circuit boards.

The printed circuit boards may include thirty-two printed circuit boards.

The connectors of each circuit board may include eight connectors.

The H-cables may be double-H cables.

A number of the lanes connecting each switch to each connector may be at least four.

The connectors of each circuit board may include four connectors.

The H-cables may be quad H-cables.

A number of lanes connecting each switch to each connector may be at least eight.

The compute nodes of each circuit board may include thirty-two compute nodes.

For each printed circuit board, the connectors may be directly connected to the printed circuit board.

For each printed circuit board, the connectors may be connected to the printed circuit board by cables.

The present disclosure is also directed to various embodiments of a method of connecting two or more printed circuit boards together in an all-to-all configuration to form a supernode. Each printed circuit board includes two or more compute nodes, two or more switches, and two or more connectors. The method also includes connecting a first plug of an H-cable to a first connector of a first printed circuit board and connecting two or more second plugs of the H-cable to two or more first connectors of two or more first printed circuit boards. The H-cable includes two or more wires connecting the first plug to the two or more second plugs.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable system or method.

BRIEF DESCRIPTION OF THE DRAWINGS

The features and advantages of embodiments of the present disclosure will be better understood by reference to the following detailed description when considered in conjunction with the drawings. The drawings are not necessarily drawn to scale.

DETAILED DESCRIPTION

Figure 1:
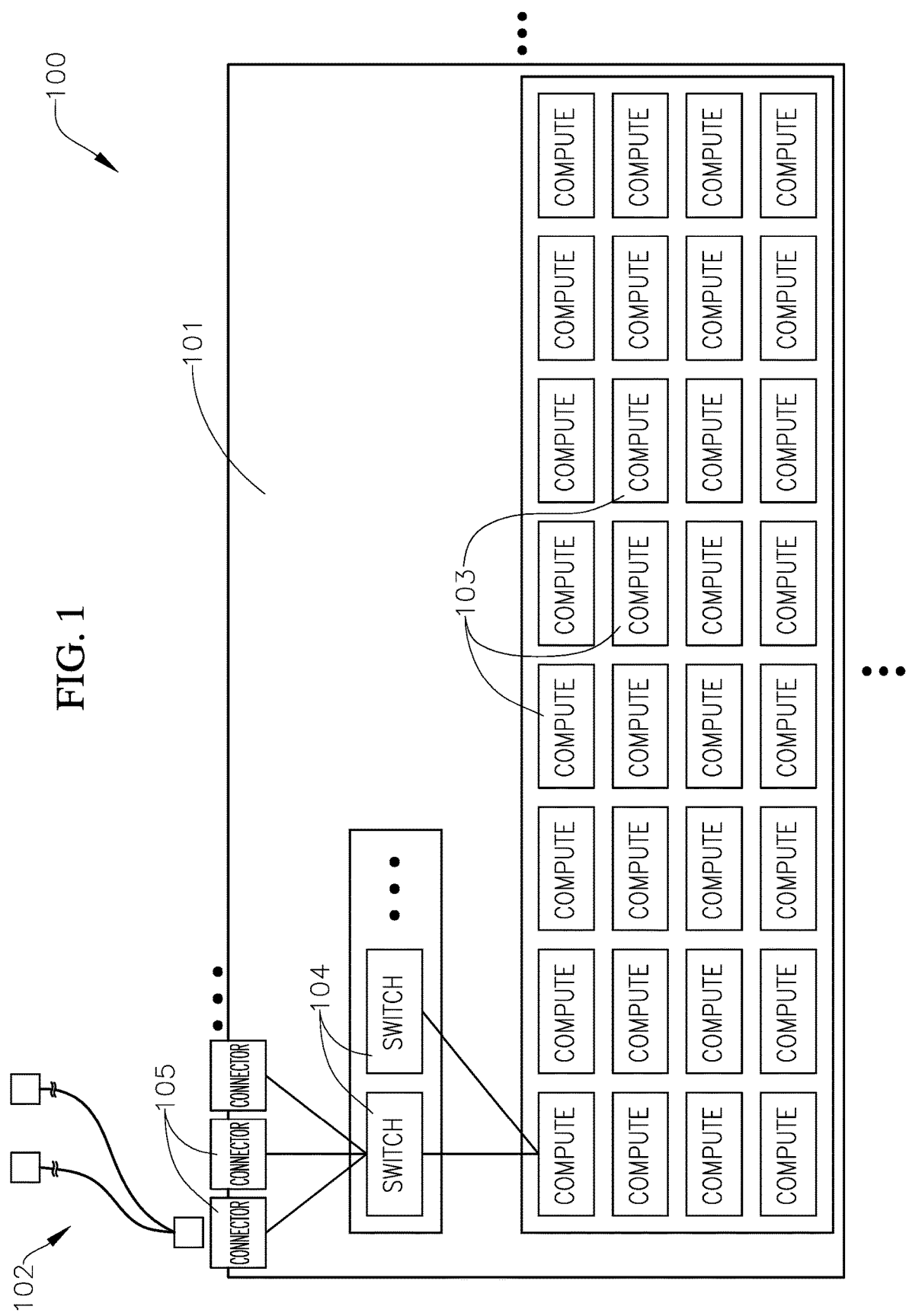
FIG. 1 is a schematic diagram of a computer supernode according to one embodiment of the present disclosure.

The present disclosure relates to various embodiments of a computer supernode including H-cables (e.g., double-H cables or quad-H cables) connecting multiple printed circuit boards (PCBs) together in an all-to-all manner. The H-cables result in shorter PCB route-lengths and smaller cable assemblies compared to related art cable assemblies. For instance, the H-cables of the present disclosure may be one quarter of a related art full rack or full supernode cabling solution, which may reduce route lengths by up to approximately 50%, approximately 75%, or more compared to related art cable assemblies. Reducing route lengths between the PCBs may eliminate or at least reduce the need for retimers, repeaters, or redrivers on the PCBs, which may reduce latency, power consumption, PCB space utilization, and bill of materials (BOM) cost. The H-cables also provide a segmented cable assembly that improves manufacturability, yield, and ease of replacement compared to a related art unified cabling solution that includes one field unit (FRU) per rack, which is costly and difficult to manufacture and handle.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

With reference now to FIG. 1, a computer supernode 100 according to one embodiment of the present disclosure includes a plurality of printed circuit boards (PCBs) 101 and a plurality of cables 102 (e.g., H-cables, such as double-H cables or quad-H cables) connecting the PCBs 101 together in an all-to-all configuration. In one or more embodiments the computer supernode 100 includes thirty-two (32) PCBs 101, although in one or more embodiments the computer supernode 100 may include any other suitable number of PCBs 101. In one or more embodiments, the computer supernode 100 may be provided in a rack.

In the illustrated embodiment, each PCB 101 includes a plurality of compute elements or nodes 103 (e.g., 32 compute nodes), a plurality of switches 104 (e.g., four switches), and a plurality of connectors 105 (e.g., 4 or 8 connectors). The connectors 105 may be directly connected to the PCB 101 or the connectors 105 may be connected to the PCB 101 with cabling (e.g., flyover cables). Each compute node 103 is connected to each of the switches 104, and each switch 104 is connected to each of the connectors 105. The connections between the switches 104 and the connectors 105 may be board-based (e.g., copper traces on the PCB 101) or cable-based.

In one or more embodiments, the number L of lanes per connector 105 is greater than or equal to the number N of PCBs 101 in the supernode 100 divided by the number M of connectors 105 in the connector quadrant of each PCB 101 (i.e., L≥N/M). In one or more embodiments, the number C of cables or wires in the cable 102 that attach to each connector 105 is equal to the number N of PCBs 101 in the supernode 100 divided by the number M of connectors 105 in the connector quadrant of each PCB 101 (i.e., C=N/M). Additionally, in one or more embodiments, the switch lane count per switch 104 to each connector 105 is greater than or equal to the number C of cables or wires connected to each connector 105. In one or more embodiments, each of the wires of the cable 102 may include a plurality of wires (e.g., multiple discrete wires) such that a plurality of signals can be communicated (transmitted and/or received) through each of the wires. That is, in one or more embodiments, each wire of the cable 102 includes multiple discrete wires to allow multiple signals to pass through that wire.

Figure 2:
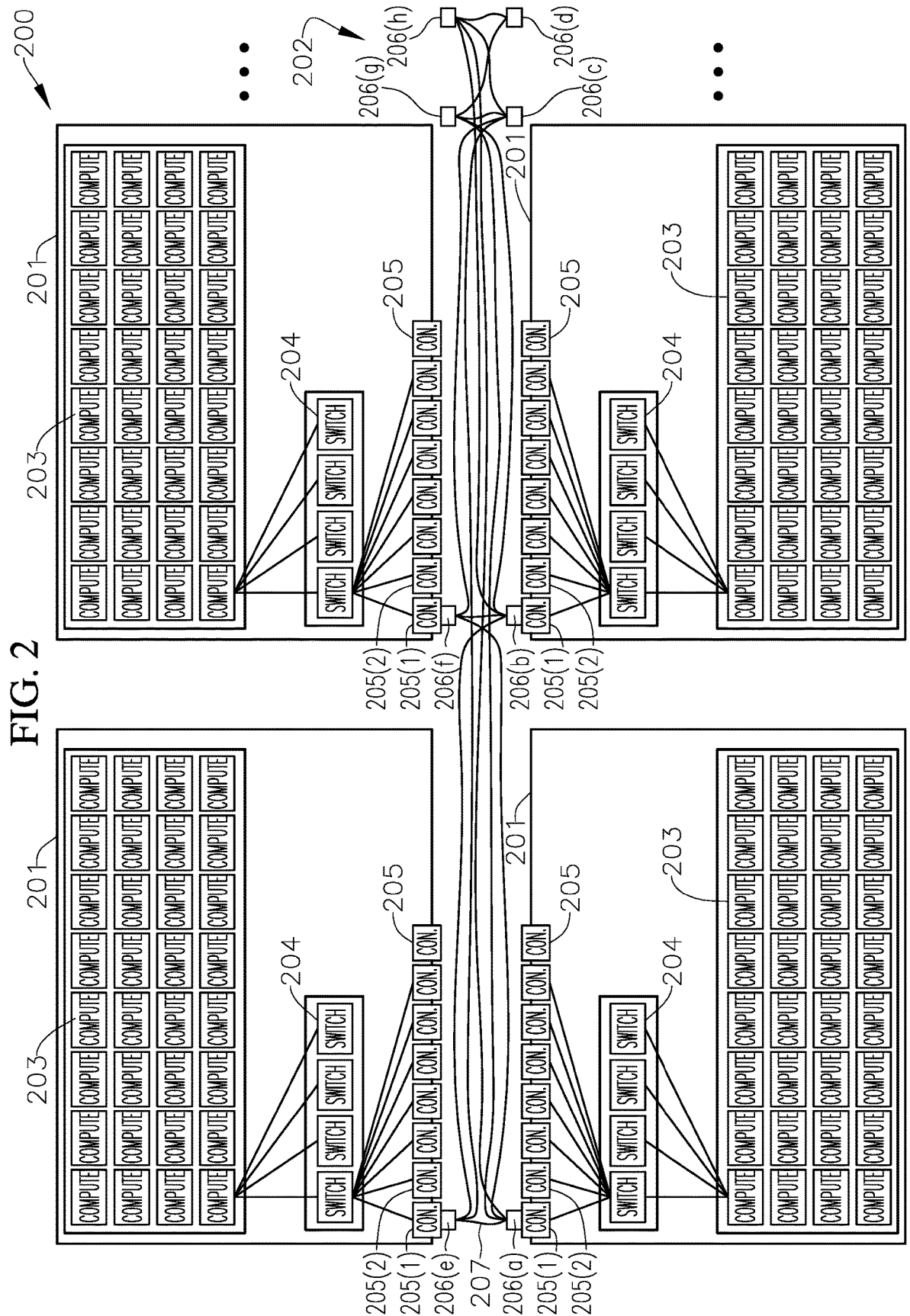
FIG. 2 is a schematic diagram of a computer supernode according to another embodiment of the present disclosure.

With reference now to FIG. 2, a computer supernode 200 according to another embodiment of the present disclosure includes a plurality of printed circuit boards (PCBs) 201 and a plurality of double-H cables 202 connecting the PCBs 201 together in an all-to-all configuration. In one or more embodiments the computer supernode 100 includes thirty-two (32) PCBs 201, although in one or more embodiments the computer supernode 200 may include any other suitable number of PCBs 201. In one or more embodiments, the computer supernode 200 may be provided in a rack.

In the illustrated embodiment, each PCB 201 includes a plurality of compute elements or nodes 203 (e.g., 32 compute nodes), a plurality of switches 204 (e.g., four switches), and eight connectors 205. The connectors 205 may be directly connected to the PCB 201 or the connectors 205 may be connected to the PCB 201 with cabling (e.g., flyover cables). Each compute node 203 is connected to each of the switches 204, and each switch 204 is connected to each of the connectors 205. The connections between the switches 204 and the connectors 205 may be board-based (e.g., copper traces on the PCB 201) or cable-based.

In one or more embodiments, the number L of lanes per connector 205 is greater than or equal to the number N of PCBs 201 in the supernode 200 divided by the number M of connectors 205 in the connector quadrant of each PCB 201 (i.e., L≥N/M). That is, the number C of cables or wires 207 of the double-H cable 202 that attach to each connector 205 is equal to the number N of PCBs 201 in the supernode 200 divided by the number M of connectors 205 in the connector quadrant of each PCB 101 (i.e., C=N/M). Accordingly, in the illustrated embodiment in which the supernode 200 includes 32 PCBs 201 and each PCB 201 includes eight connectors 205, each connector 205 is connected to four different PCBs 201 (i.e., four cables or wires 207 are connected to each connector 205). Additionally, in one or more embodiments, the switch lane count per switch 204 to each connector 205 is greater than or equal to the number C of wires 207 connected to each connector 205. In the illustrated embodiment, a lane from each switch 204 routes off to each of the four PCBs 201 that are connected to each connector 205 such that each connector 205 includes at least sixteen lanes (i.e., each connector 205 includes four lanes from each of the four switches 204). In one or more embodiments, each of the wires 207 of the double-H cable 202 may include a plurality of wires (e.g., multiple discrete wires) such that a plurality of signals can be communicated (transmitted and/or received) through each of the wires 207. That is, in one or more embodiments, each wire 207 of the double-H cable 202 includes multiple discrete wires to allow multiple signals to pass through that wire 207.

In the illustrated embodiment, each of the double-H cables 202 includes eight plugs 206 (e.g., a lower row of four plugs 206(a)-206(d) and an upper row of four plugs 206(e)-206(h)). Each plug 206 in the double-H cable 202 is connected by four wires 207 to four other plugs 206. For example, a first plug 206(a) in the lower row of the double-H cable 202 is connected by a first wire to a first plug 206(e) in the upper row, a second wire to a second plug 206(f) in the upper row, a third wire to a third plug 206(g) in the upper row, and a fourth wire to a fourth plug 206(g) in the upper row (i.e., the first plug 206(a) in the lower row is connected by wires to each of the plugs 206(e)-206(h) in the upper row). Similarly, the second plug 206(b) in the lower row of the double-H cable 202 is connected by wires 207 to each of the plugs 206(e)-206(h) in the upper row; the third plug 206(c) in the lower row of the double-H cable 202 is connected by wires 207 to each of the plugs 206(e)-206(h) in the upper row; and the fourth plug 206(d) in the lower row of the double-H cable 202 is connected by wires 207 to each of the plugs 206(e)-206(h) in the upper row).

In the illustrated embodiment in which each PCB 201 includes eight connectors 205 and the computer supernode 200 includes thirty-two PCBs 201, the supernode 200 includes eight double-H cables 202 connecting the PCBs 201 together in an all-to-all configuration. Each double-H cable 202 connects one PCB 201 to four other PCBs 201 in the computer supernode 200. For instance, the first, second, third, and fourth plugs 206(a)-206(d) in the lower row of a first double-H cable 202(1) connect to a first connector 205(1) of a first, second, third, and fourth PCB 201, respectively, and the first, second, third, and fourth plugs 206(e)-206(h) in the upper row of the first double-H cable 202(1) connect to the first connector 205(1) in each of fifth, sixth, seventh, and eighth PCB 201, respectively. In this manner, the first double-H cable 202(1) connects each of the first, second, third, and fourth PCB 201 to the fifth, sixth, seventh, and eighth PCBs 201. Additionally, the first, second, third, and fourth plugs 206(a)-206(d) in the lower row of a second double-H cable 202 connect to a second connector 205(2) of the first, second, third, and fourth PCBs, respectively, and the first, second, third, and fourth plugs 206(e)-206(h) in the upper row of the second double-H cable 202 connect to the first connector 205(1) in each of ninth, tenth, eleventh, and twelfth PCBs 201, respectively. This pattern repeats, with the third, fourth, fifth, sixth, seventh, and eighth double-H cables 202 connecting the remainder of the thirty-two PCBs 201 in an all-to-all manner.

Utilizing the double-H cables 202 to connect the PCBs 201 together results in shorter PCB route-lengths and smaller cable assemblies compared to related art cable assemblies (e.g., the double-H cables 202 may reduce PCB route-lengths by up to approximately 50%, approximately 75%, or more compared to related art cable assemblies). Reducing route lengths between the PCBs may eliminate or at least reduce the need for retimers, repeaters, or redrivers on the PCBs, which may reduce latency, power consumption, PCB space utilization, and bill of materials (BOM) cost. The double-H cables 202 also provide a segmented cable assembly that improves manufacturability, yield, and ease of replacement compared to a related art unified cabling solution that includes one field unit (FRU) per rack, which is costly and difficult to manufacture and handle.

Figure 3:
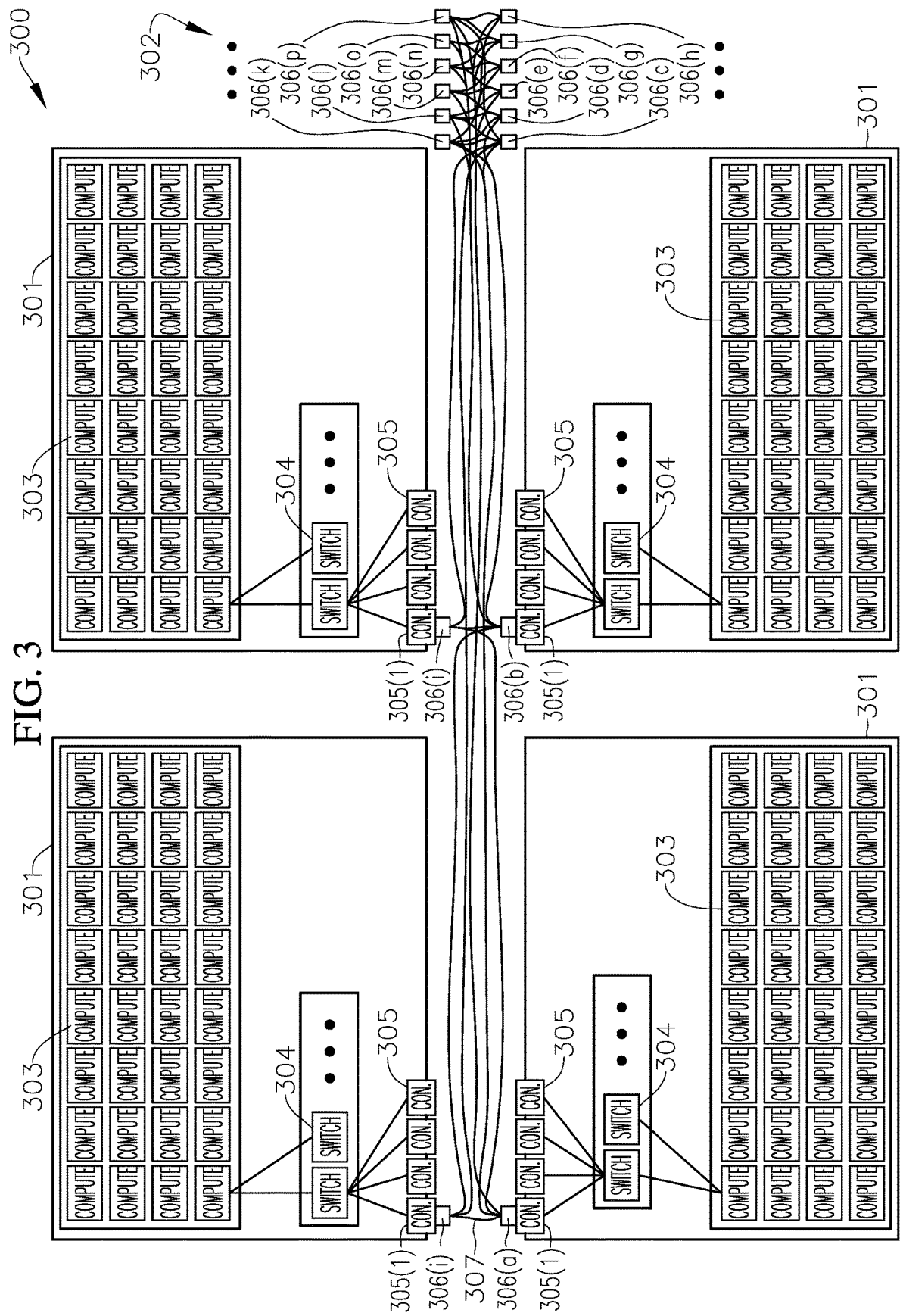
FIG. 3 is a schematic diagram of a computer supernode according to a further embodiment of the present disclosure.

With reference now to FIG. 3, a computer supernode 300 according to another embodiment of the present disclosure includes a plurality of printed circuit boards (PCBs) 301 and a plurality of quad-H cables 302 connecting the PCBs 301 together in an all-to-all configuration. In one or more embodiments the computer supernode 300 includes thirty-two (32) PCBs 301, although in one or more embodiments the computer supernode 300 may include any other suitable number of PCBs 301. In one or more embodiments, the computer supernode 300 may be provided in a rack.

In the illustrated embodiment, each PCB 301 includes a plurality of compute elements or nodes 303 (e.g., 32 compute nodes), a plurality of switches 304 (e.g., four switches), and four connectors 305. The connectors 305 may be directly connected to the PCB 301 or the connectors 305 may be connected to the PCB 301 with cabling (e.g., flyover cables). Each compute node 303 is connected to each of the switches 304, and each switch 304 is connected to each of the connectors 305. The connections between the switches 304 and the connectors 305 may be board-based (e.g., copper traces on the PCB 301) or cable-based.

In one or more embodiments, the number L of lanes per connector 305 is greater than or equal to the number N of PCBs 301 in the supernode 300 divided by the number M of connectors 305 in the connector quadrant of each PCB 301 (i.e., L≥N/M). That is, the number C of cables or wires 307 of the quad-H cable 302 that attach to each connector 305 is equal to the number N of PCBs 301 in the supernode 300 divided by the number M of connectors 305 in the connector quadrant of each PCB 301 (i.e., C=N/M). Accordingly, in the illustrated embodiment in which the supernode 300 includes 32 PCBs 301 and each PCB 301 includes four connectors 305, each connector 305 is connected to eight different PCBs 301 (i.e., eight cables or wires 307 are connected to each connector 305). Additionally, in one or more embodiments, the switch lane count per switch 304 to each connector 305 is greater than or equal to the number C of cables or wires 307 of the quad-H cable 302 connected to each connector 305. In the illustrated embodiment, a lane from each switch 304 routes off to each of the four PCBs 301 that are connected to each connector 305 such that each connector 305 includes at least thirty-two lanes (i.e., each connector 305 includes eight lanes from each of the four switches 304). In one or more embodiments, each of the wires 307 of the quad-H cable 302 may include a plurality of wires (e.g., multiple discrete wires) such that a plurality of signals can be communicated (transmitted and/or received) through each of the wires 307. That is, in one or more embodiments, each wire 307 of the quad-H cable 302 includes multiple discrete wires to allow multiple signals to pass through that wire 307.

In the illustrated embodiment, each of the quad-H cables 302 includes sixteen plugs 306 (e.g., a lower row of eight plugs 306(a)-306(h) and an upper row of eight plugs 306(i)-306(p)). Each plug 306 in the quad-H cable 302 is connected by eight wires 307 to four other plugs 306. For example, a first plug 306(a) in the lower row of the quad-H cable 302 is connected by a first wire to a first plug 306(i) in the upper row, a second wire to a second plug 306(j) in the upper row, a third wire to a third plug 306(k) in the upper row, a fourth wire to a fourth plug 306(l) in the upper row, a fifth wire to a fifth plug 306(m) in the upper row, a sixth wire to a sixth plug 306(n) in the upper row, a seventh wire to a seventh plug 306(o) in the upper row, and an eighth wire to an eighth plug 306(p) in the upper row (i.e., the first plug 306(a) in the lower row is connected by wires 307 to each of the plugs 306(i)-306(p) in the upper row). Similarly, the second plug 306(b) in the lower row of the quad-H cable 302 is connected by wires 307 to each of the plugs 306(i)-306(p) in the upper row; the third plug 306(c) in the lower row of the quad-H cable 302 is connected by wires 307 to each of the plugs 306(i)-306(p) in the upper row; the fourth plug 306(d) in the lower row of the quad-H cable 302 is connected by wires 307 to each of the plugs 306(i)-306(p) in the upper row; the fifth plug 306(e) in the lower row of the quad-H cable 302 is connected by wires 307 to each of the plugs 306(i)-306(p) in the upper row; the sixth plug 306(f) in the lower row of the quad-H cable 302 is connected by wires 307 to each of the plugs 306(i)-306(p) in the upper row; the seventh plug 306(g) in the lower row of the quad-H cable 302 is connected by wires 307 to each of the plugs 306(i)-306(p) in the upper row; and the eighth plug 306(h) in the lower row of the quad-H cable 302 is connected by wires 307 to each of the plugs 306(i)-306(p) in the upper row).

In the illustrated embodiment in which each PCB 301 includes four connectors 305 and the computer supernode 300 includes thirty-two PCBs 301, the supernode 300 includes four quad-H cables 302 connecting the PCBs 301 together in an all-to-all configuration. Each quad-H cable 302 connects one PCB 301 to eight other PCBs 301 in the computer supernode 300. For instance, the first, second, third, fourth, fifth, sixth, seventh, and eighth plugs 306(a)-306(h) in the lower row of a first quad-H cable 302(1) connect to a first connector 305(1) of a first, second, third, fourth, fifth, sixth, seventh, and eighth PCBs 301, respectively, and the first, second, third, fourth, fifth, sixth, seventh, and eighth plugs 306(i)-306(p) in the upper row of the first quad-H cable 302(1) connect to the first connector 305(1) in each of ninth, tenth, eleventh, twelfth, thirteenth, fourteenth, fifteenth, and sixteenth PCBs 301, respectively. In this manner, the first quad-H cable 302(1) connects each of the first, second, third, fourth, fifth, sixth, seventh, and eighth PCBs 301 to the ninth, tenth, eleventh, twelfth, thirteenth, fourteenth, fifteenth, and sixteenth PCBs 301. Additionally, the first, second, third, fourth, fifth, sixth, seventh, and eighth plugs 306(a)-306(h) in the lower row of a second quad-H cable 302 connect to a second connector 305(2) of the first, second, third, fourth, fifth, sixth, seventh, and eighth PCB 301, respectively, and the first, second, third, fourth, fifth, sixth, seventh, and eighth plugs 306 in the upper row of the second quad-H cable 302 connect to the first connector 305(1) in each of a seventeenth, eighteenth, nineteenth, twentieth, twenty-first, twenty-second, twenty-third, and twenty-fourth PCB 301, respectively. This pattern repeats, with the third and fourth quad-H cables 302 connecting the remainder of the thirty-two PCBs 301 in an all-to-all manner.

Utilizing the quad-H cables 302 to connect the PCBs 301 together results in shorter PCB route-lengths and smaller cable assemblies compared to related art cable assemblies (e.g., the quad-H cables 302 may reduce PCB route-lengths by up to approximately 50%, approximately 75%, or more compared to related art cable assemblies). Reducing route lengths between the PCBs may eliminate or at least reduce the need for retimers, repeaters, or redrivers on the PCBs, which may reduce latency, power consumption, PCB space utilization, and bill of materials (BOM) cost. The double-H cables 202 also provide a segmented cable assembly that improves manufacturability, yield, and ease of replacement compared to a related art unified cabling solution that includes one field unit (FRU) per rack, which is costly and difficult to manufacture and handle.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A computer supernode comprising:
a plurality of printed circuit boards, each printed circuit board of the plurality of printed circuit boards comprising:
a plurality of compute nodes;
a plurality of switches; and
a plurality of connectors,
wherein the plurality of compute nodes is connected to each switch of the plurality of switches, and
wherein the plurality of switches is connected to each connector of the plurality of connectors by a plurality of lanes; and
a plurality of H-cables connecting the plurality of printed circuit boards together in an all-to-all configuration, wherein each H-cable of the plurality of H-cables connects a connector of a first printed circuit board of the plurality of printed circuit boards to a connector in each of two or more other printed circuit boards of the plurality of printed circuit boards.

2. The computer supernode of claim 1, wherein the plurality of printed circuit boards comprises thirty-two printed circuit boards.

3. The computer supernode of claim 2, wherein the plurality of connectors of each printed circuit board of the plurality of printed circuit boards comprises eight connectors.

4. The computer supernode of claim 3, wherein the plurality of H-cables is a plurality of double-H cables.

5. The computer supernode of claim 3, wherein a number of the plurality of lanes connecting each switch of the plurality of switches to each connector of the plurality of connectors is at least four.

6. The computer supernode of claim 2, wherein the plurality of connectors of each printed circuit board of the plurality of printed circuit boards comprises four connectors.

7. The computer supernode of claim 6, wherein the plurality of H-cables is a plurality of quad-H cables.

8. The computer supernode of claim 6, wherein a number of the plurality of lanes connecting each switch of the plurality of switches to each connector of the plurality of connectors is at least eight.

9. The computer supernode of claim 2, wherein the plurality of compute nodes of each printed circuit board of the plurality of printed circuit boards comprises thirty-two compute nodes.

10. The computer supernode of claim 1, wherein, for each printed circuit board of the plurality of printed circuit boards, the plurality of connectors is directly connected to the printed circuit board.

11. The computer supernode of claim 1, wherein, for each printed circuit board of the plurality of printed circuit boards, the plurality of connectors is connected to the printed circuit board by cables.

12. A method of connecting a plurality of printed circuit boards together in an all-to-all configuration to form a supernode, wherein each printed circuit board of the plurality of printed circuit boards comprises a plurality of compute nodes, a plurality of switches, and a plurality of connectors, the method comprising:
connecting a first plug of a plurality of first plugs of an H-cable to a first connector of a first printed circuit board of the plurality of printed circuit boards; and
connecting a plurality of second plugs of the H-cable to a plurality of first connectors of a plurality of first printed circuit boards of the plurality of printed circuit boards,
wherein the H-cable comprises a plurality of wires connecting the first plug to the plurality of second plugs.

13. The method of claim 12, wherein:
each printed circuit board comprises eight connectors,
the H-cable is a double-H cable,
the plurality of first plugs comprises four first plugs,
the plurality of second plugs comprises four second plugs, and
the connecting the plurality of second plugs comprises connecting the four second plugs to four printed circuit boards of the plurality of printed circuit boards.

14. The method of claim 13, wherein the plurality of printed circuit boards comprises thirty-two circuit boards, and wherein the method further comprising connecting a second double-H cable, a third double-H cable, a fourth double-H cable, a fifth double-H cable, a sixth double-H cable, a seventh double-H cable, and an eighth double-H cable to the plurality of printed circuit boards.

15. The method of claim 12, wherein:
each printed circuit board comprises four connectors,
the H-cable is a quad-H cable,
the plurality of first plugs comprises eight first plugs,
the plurality of second plugs comprises eight second plugs, and
the connecting the plurality of second plugs comprises connecting the eight second plugs to eight printed circuit boards of the plurality of printed circuit boards.

16. The method of claim 15, wherein the plurality of printed circuit boards comprises thirty-two circuit boards, and wherein the method further comprising connecting a second quad-H cable, a third quad-H cable, and a fourth quad-H cable to the plurality of printed circuit boards.

17. The method of claim 12, wherein a number of a plurality of lanes connecting each switch of the plurality of switches to each connector of the plurality of connectors is at least four.

18. The method of claim 16, wherein a number of a plurality of lanes connecting each switch of the plurality of switches to each connector of the plurality of connectors is at least eight.

19. The method of claim 12, wherein the plurality of compute nodes of each circuit board of the plurality of printed circuit boards comprises thirty-two compute nodes.

20. The method of claim 12, wherein, for each printed circuit board of the plurality of printed circuit boards, the plurality of connectors is directly connected to the printed circuit board or the plurality of connectors is connected to the printed circuit board by cables.

* * * * *